United States Patent [19]

Tashiro et al.

[11] Patent Number: 5,113,093
[45] Date of Patent: May 12, 1992

[54] SEMICONDUCTOR INTEGRATED CIRCUIT WITH MULTIPLE OPERATION

[75] Inventors: Tetsu Tashiro; Minoru Takeuchi; Yoshiyuki Ishimaru; Shinichi Hirose; Kazuo Hayashi, all of Itami, Japan

[73] Assignee: Mitsubishi Denki Kabushiki Kaisha, Tokyo, Japan

[21] Appl. No.: 550,604

[22] Filed: Jul. 10, 1990

[30] Foreign Application Priority Data

Jul. 11, 1989 [JP] Japan ................................ 1-178417

[51] Int. Cl.⁵ ......................................... H03K 19/094
[52] U.S. Cl. .................................... 307/465; 307/451; 365/238.5
[58] Field of Search ..................... 307/202.1, 443, 451, 307/465, 475, 362; 365/189.03, 238.5

[56] References Cited

U.S. PATENT DOCUMENTS

| | | | |
|---|---|---|---|
| 4,350,906 | 9/1982 | Gillberg | 307/451 X |
| 4,504,926 | 3/1985 | Toyoda | 364/900 |
| 4,816,665 | 3/1989 | Nakano et al. | 235/380 |
| 4,907,203 | 3/1990 | Wada et al. | 365/189.03 X |
| 4,910,710 | 3/1990 | Kobatake | 365/189.03 X |
| 4,940,909 | 7/1990 | Mulder et al. | 307/202.1 X |
| 4,970,727 | 11/1989 | Miyawaki et al. | 371/21.3 |
| 4,982,113 | 1/1991 | Jimbo | 365/180.03 X |
| 4,987,325 | 1/1975 | Seo | 307/465 |
| 4,990,800 | 2/1991 | Lee | 307/465 |

FOREIGN PATENT DOCUMENTS 084247 12/1982 European Pat. Off. .

OTHER PUBLICATIONS

Pat. Abst. of Japan, vol. 11, No. 338, Nov. 5, 1987 & JP-A-62 118567 (Ricoh) May 29, 1987.
Pat. Abst. of Japan, vol. 23, No. 377 (P-922) 8/22/89 & JP-A-1 130394 (Mitsubishi) May 23, 1989.
Pat. Abst. of Japan, vol. 9, No. 156 (P-368) (1879) Jun. 29, 1985 & JP-A-60 031641 (Nippon Denso K.K.) Feb. 18, 1985.
IBM Tech. Disc. Bulletin, vol. 30, No. 9, Feb. 1988, NY., N.Y., pp. 187-188.
Motorola Semiconductor Technical Data, 1985, Motorola.
Data Book of Mitsubishi Semiconductor, 1986, Mitsubishi.

Primary Examiner—David Hudspeth
Attorney, Agent, or Firm—Townsend and Townsend

[57] ABSTRACT

When the reset input changes 0 V to Vcc, predetermined operational mode control information is set in an operational mode register (11) to establish a user operational mode. When the reset input changes from 0 V to 2 Vcc, the operational mode control information inputted to a predetermined terminal of the input/output port (25, 58) is set in the operational mode control unit (10a, 10b) to establish a test or other mode.

4 Claims, 7 Drawing Sheets

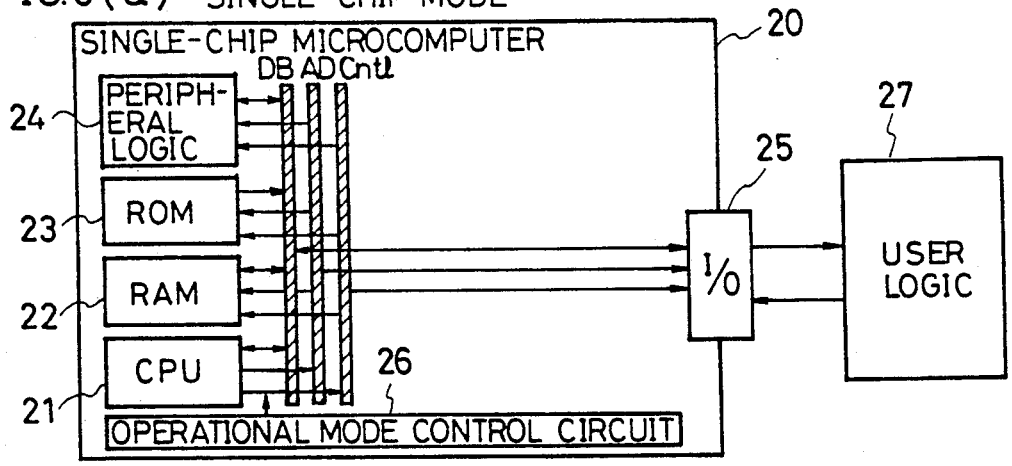
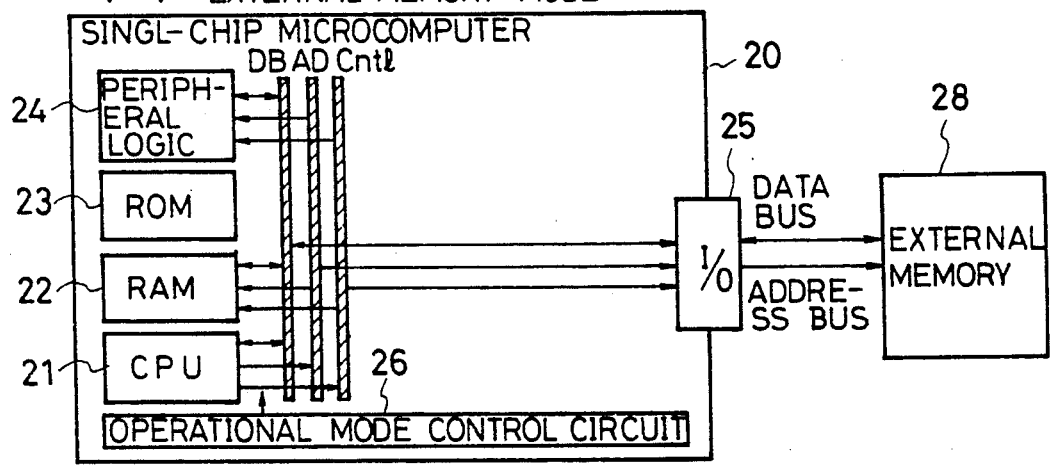
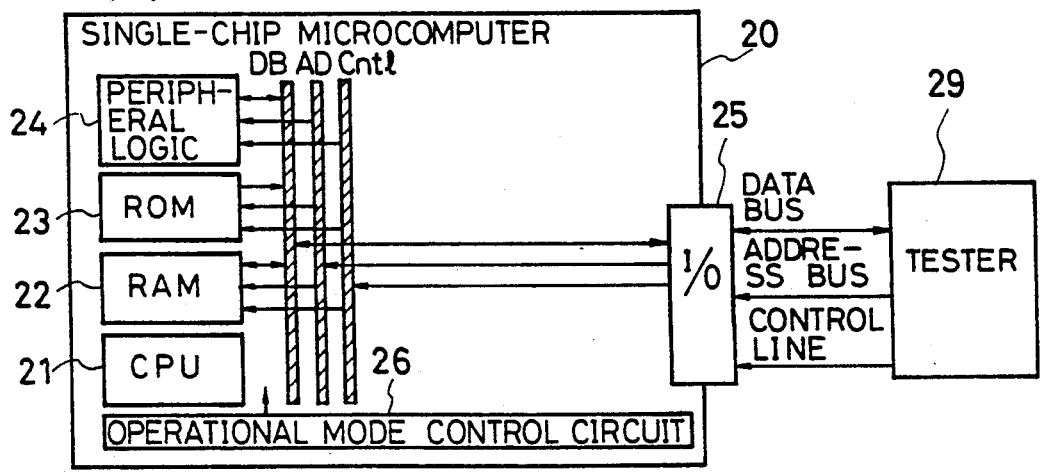

SEMICONDUCTOR INTEGRATED CIRCUIT WITH MULTIPLE OPERATION

BACKGROUND OF THE INVENTION

The present invention relates to semiconductor integrated circuits such as single-chip microcomputers and digital signal processors which require distinction of the user mode from the mode used by the maker upon shipping.

Various operational modes of a single-chip microcomputer are shown in FIGS. 6(a), 6(b), and 6(c). The single-chip microcomputer 20 consists of a central processing unit 21 for performing arithmetic and logic operations; a random access memory 22 for temporarily storing data necessary for data processing; a read only memory 23 for storing in advance data such as programs necessary for data processing; a peripheral logic circuit 24; an input/output port 25; an operational mode control circuit 26 responsive to set operational mode control information to control gates between the CPU 21 and ROM 23, and data and address buses and control lines on a single chip.

In FIG. 6(a), a separate user logic circuit 27 is connected to the single-chip microcomputer 20 in the single chip mode. In this single chip mode, the microcomputer 20 controls the user logic 27 via the I/O port 25 and receives data from the user logic 27. The microcomputer 20 operates according to the program stored in the ROM 23.

In FIG. 6(b), an external memory 28 is connected to the single-chip computer 20 in the external memory mode. In this external memory mode, the external memory 28 is accessed for exchange of data on an address or data bus, or a few control lines via the specified I/O port 25. The program is stored in the external memory 28, and the ROM 23 is not used.

In FIG. 6(c), a tester 29 is connected to the single-chip microcomputer 20 in the module test mode. This module test mode is used by the microcomputer maker. Address data and control signals are fed to the single-chip microcomputer 20 from the tester 29 to operate the peripheral logic 24, ROM 23, and RAM 22 for testing the microcomputer 20. In the modes of FIGS. 6(a) and 6(b), the CPU 21 controls access to the peripheral logic 24, ROM 23, and RAM 22 but, in the module test mode of FIG. 6(c), the peripheral logic 24, ROM 23, and RAM 22 are tested by separating the CPU 21 from the internal buses of the microcomputer 20.

Respective timing charts of the single-chip mode in FIG. 6(a), the external memory mode in FIG. 6(b), and the module test mode in FIG. 6(c) are shown in FIGS. 7(a), 7(b), and 7(c). The I/O port 25 serves as a double function port through which address, data, and control signals are inputted and outputted in the modes other than single chip mode, where it operates as a simple port through which data is inputted and outputted by the program. In the external memory mode of FIG. 6(b), the microcomputer 20 outputs address and control signals while the data bus serves as an input/output. At this point, the value of the I/O port 25, which is outputted in FIG. 6(a), is no longer outputted. That is, the I/O port 25 functions as a simple bus buffer. In the module test mode of FIG. 6(c), the microcomputer 20 receives the address and control signals from the tester 29 while the data bus serves as an input/output. In this case, too, no value of the port latch is outputted.

A conventional operational mode control circuit 26a for setting the above operational modes is shown in FIG. 8. The operational mode register 41, which is composed of a register of one or more bits, stores operational mode control information for distinguishing the respective operational modes. A value is set in this register 41 by inputting a mode input value into the mode input terminal 47 which is dedicated to mode setting. A plurality of mode input terminals 47 may be provided, but the number of mode input terminals is reduced by providing a level decision circuit 42 into which three different levels 0 V, $V_{cc}$, and 2 $V_{cc}$ (twice $V_{cc}$) are inputted.

Another conventional operational mode control circuit 26b in a single-chip microcomputer is shown in FIG. 9. The operational mode register 51 is accessed from the data bus 59 via a path 61. The data bus 59 is interfaced with the outside via a port 58 which serves as a data bus buffer. The operational mode register 51 is made such that operational mode control information is set not only in response to the mode input level at the mode input terminal 57 (or the decision result of the level decision circuit 52) but also via the data bus 59.

The conventional semiconductor integrated circuit requires at least one mode input terminal dedicated to mode setting and has a disadvantage for single-chip microcomputers in which only a limited number of pins are available. In addition, as the number of operational modes increases, there is a demand for two or more mode input terminals.

SUMMARY OF THE INVENTION

Accordingly, it is an object of the invention to provide a semiconductor integrated circuit which allows setting a large number of operational modes without using any mode input terminals.

According to the invention there is provided a semiconductor integrated circuit which includes an operational mode control unit for setting, when a reset input is in a first level change, predetermined operational mode control information in an operational mode setting unit and, when the reset input is in a second level change, operational mode control information from a predetermined terminal of an input/output port in the operational mode setting unit.

According to the invention, the reset input terminal of a semiconductor integrated circuit is used to set a predetermined operational mode control information in a setting unit, such as an operational mode register, to establish a user operational mode when a reset input is in the first level change, for example, from 0 V to $V_{cc}$, and the operational mode control information inputted to a predetermined terminal of an input/output port in the operational mode setting unit to establish a test or other operational mode when the reset input is in the second level change, for example, from 0 V to 2 $V_{cc}$.

The above and other objects, features, and advantages of the invention will become more apparent from the following description when taken in conjunction with the accompanying drawings.

BRIEF DESCRIPTION OF THE DRAWINGS

FIG. 6(a) is a block diagram of the essential part of a single-chip microcomputer in the single-chip mode;

FIG. 6(b) is a block diagram of the essential part of a single-chip microcomputer in the external memory mode;

FIG. 6(c) is a block diagram of the essential part of a single-chip microcomputer in the module test mode;

DESCRIPTION OF THE PREFERRED EMBODIMENT

Figure 1A:
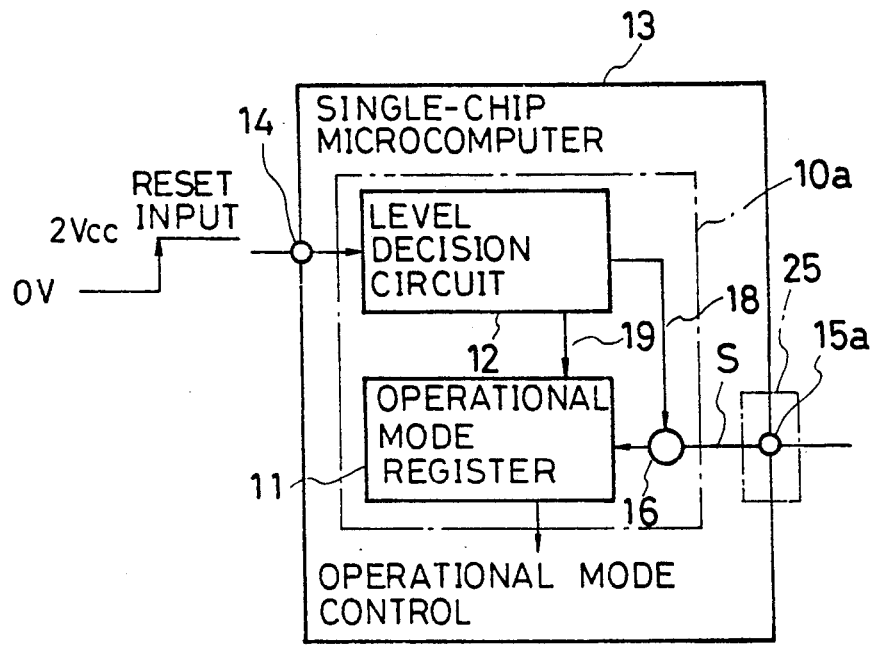
FIG. 1(a) is a block diagram of the essential part of a single-chip microcomputer according to an embodiment of the invention.
Figure 8:
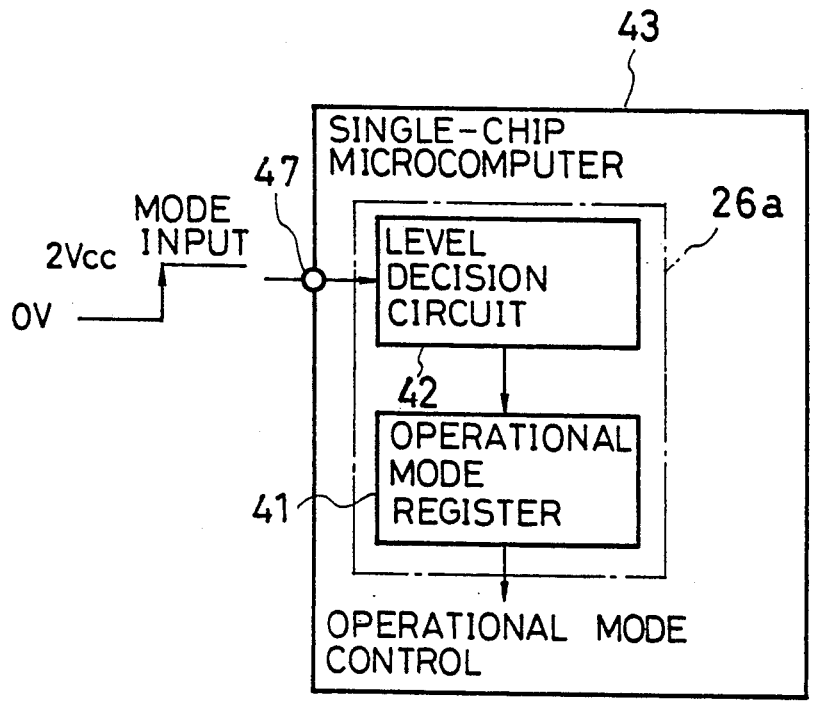
FIG. 8 is a block diagram of the essential part of a conventional single-chip microcomputer.
Figure 9:
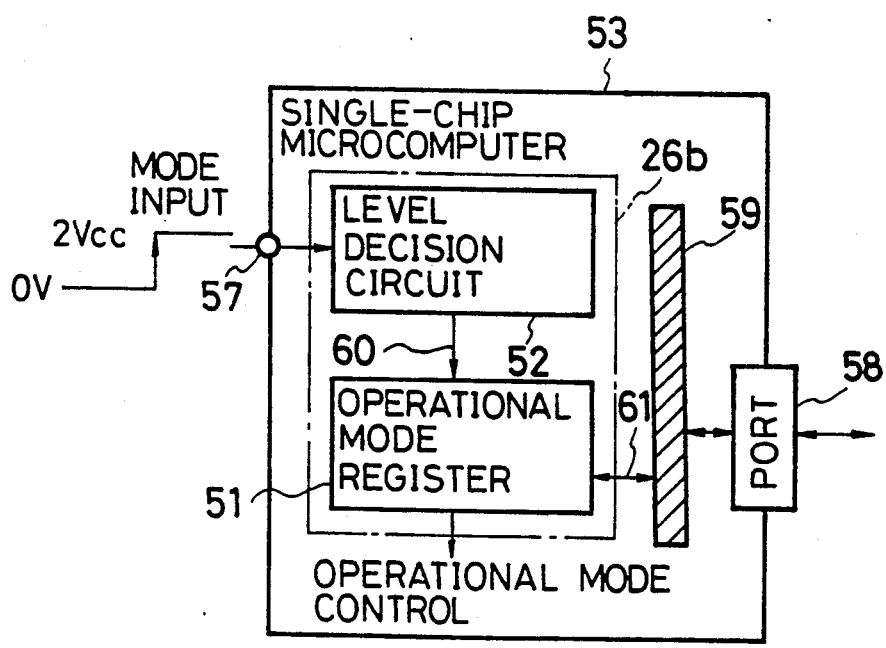
FIG. 9 is a block diagram of the essential part of another conventional single-chip microcomputer.

In FIG. 1(a), components of a single-chip microcomputer, such as CPU and RAM, are omitted for simplicity as in FIGS. 8 and 9. A single-chip microcomputer 13 includes a reset input terminal 14; a mode setting terminal 15a assigned to a predetermined terminal of an I/O port 25; an operational mode control circuit 10a according to an embodiment of the invention; an operational mode register 11 for storing operational mode control information to set an operational mode; a level decision circuit 12 for deciding the level of a reset signal from the reset input terminal 14; and a mode setting control circuit 16 responsive to the decision result of the level decision circuit 12 to feed operational mode control information from the mode setting terminal 15a to the operational mode register 11. It further includes a control line 18 for transmitting an output signal from the level decision circuit 12 to the mode setting control circuit 16; a control line 19 for transmitting a user mode value to the operational mode register 11 as predetermined operational mode control information; and a signal line S for connecting the mode setting terminal 15a to the mode setting control circuit 16. The mode setting terminal 15a is a double function port which returns to the original role in normal operation after reset release.

Now, the operation is described below. In the user operational mode, the level decision circuit 12 recognizes the 0 V level of a reset input at the reset input terminal 14 and sets the value of a user mode (or operational mode control information) in the operational mode register 11 via the control line 19. When the reset input rises from 0 V to $V_{cc}$, the reset condition is released to start operation. At this point, the operational mode register 11 holds the value set by resetting.

In the maker operational mode, on the other hand, the level decision circuit 12, which operates in the same way as in the above user mode at a 0 V reset input, recognizes the rising edge of a reset input from 0 V to 2 $V_{cc}$ and transfers data inputted from the mode setting terminal 15a to the operational mode register 11 via the mode setting control circuit 16. Then, in response to the operational mode control information from the operational mode register 11, the operational modes of respective components, such as CPU 21 and ROM 23, are set to start the microcomputer 13. After the initial value is set in the operational mode register 11, the mode setting terminal 15a is used as a normal function terminal.

Figure 1B:
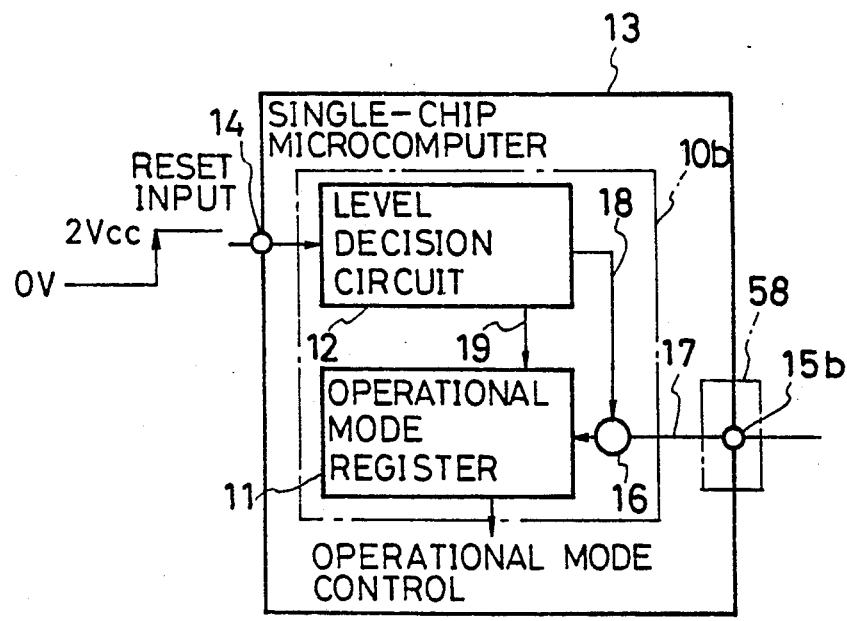
FIG. 1(b) is a block diagram of the essential part of a single-chip microcomputer according to another embodiment of the invention.

In FIG. 1(b), like numeral references denote like or corresponding components of FIG. 1(a), and their description is omitted. A data bus 17 is connected to a mode setting terminal 15b which is assigned to a predetermined terminal of a port 58 as a data bus buffer. This is the case where the invention is applied to the conventional circuit of FIG. 9, in which the data bus also is used for setting the initial value of the operational mode register 11.

In the user operational mode, the operation is the same as in the above embodiment. In the maker operational mode, too, the operation is almost the same as in the above embodiment. When the level decision circuit 12 recognizes the rising edge of a reset input from 0 V to 2 $V_{cc}$, data is transferred from the bus buffer or mode setting terminal 15b to the operational mode register 11 via the mode setting control circuit 16 and the data bus 17. In response to the operational mode control information from the operational mode register 11, the operational modes of respective components are set to start the microcomputer 13. The mode setting terminal 15b is used as a normal function terminal after the initial value is set in the operational mode register 11.

As has been described above, the mode setting control circuit receives data from the mode setting terminal with a special signal, such as the rising edge of a reset input from 0 V to 2 $V_{cc}$, to set data in the operational mode register. Consequently, the microcomputer receives data from the mode setting terminal to set a value in the operational mode register with a special signal, such as the rising edge of a reset input from 0 V to 2 $V_{cc}$, thus entering the desired operational mode.

Figure 2:
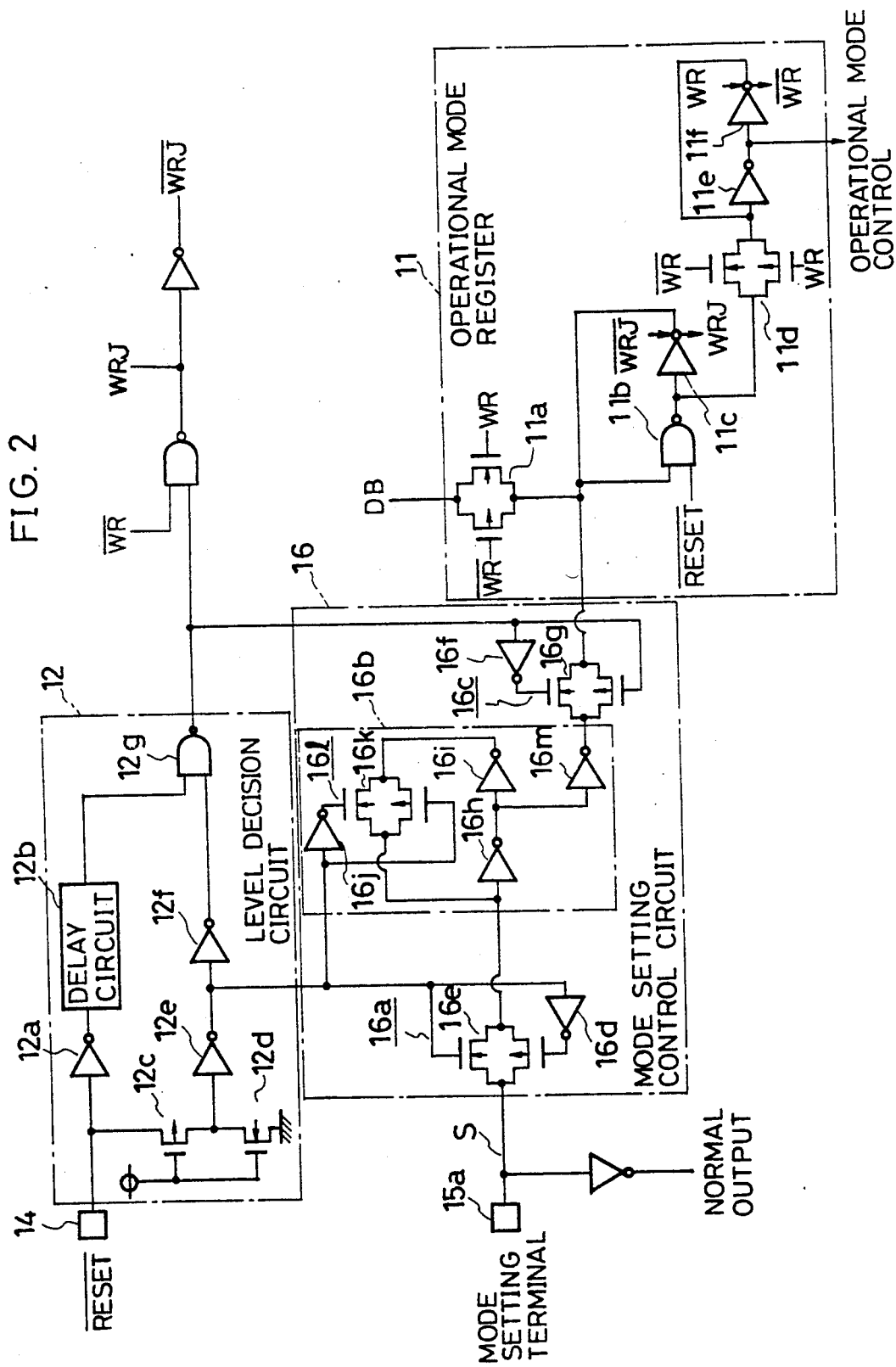
FIG. 2 is a schematic diagram of the essential part or operational mode control circuit of a single-chip microcomputer.

The operational mode control circuits of the above two embodiments are almost the same, and only that of FIG. 1(a) is shown in FIG. 2. The level decision circuit 12 includes an inverter 12a for inverting a reset input from the reset input terminal 14; a delay circuit 12b composed of a multistage inverter for delaying the output of the inverter 12a; a pair of FETs 12c and 12c connected in series for detecting a 2-$V_{cc}$ reset input; two stages of inverters 12e and 12f for inverting the output at the junction of the FETs; and a NAND gate 12g for receiving outputs from the inverter 12f and the delay circuit 12b.

The mode setting control circuit 16 includes the first gate 16a responsive to a value from the junction between the inverters 12e and 12f to turn on or off an input from the mode setting terminal 15a; a latch circuit 16b responsive to the same value as above to latch an output from the first gate 16a; and the second gate 16c responsive to an output from the NAND gate 12g to turn on or off an output of the latch circuit 16b. The gates 16a and 16c each consist of an inverter 16d, 16f and a transmission 16e, 16g. The latch circuit 16b consists of two stages of inverters 16h and 16i, an inverter 16j, and a transmission 16k, a gate 16l responsive to a value from the junction between the inverters 12e and 12f to turn on or off the interconnection between the inverters 16h and 16i, and an inverter 16m for inverting a value from the junction between the inverters 16h and 16i.

The operational mode register 11 consists of a NAND gate 11b connected to an output of the mode setting control circuit 16 and a data bus via a transmission (gate) 11a at one input and a reset input at the other input; a clock gated inverter 11c for inverting an output of the NAND gate and feeding it back to the one input; a transmission 11d for turning on or off an output from the junction between the NAND gate 11b and the clock gated inverter 11c; and two stages of inverters 11de and 11f for inverting an output of the transmission 11d. The output of the two stage inverter is fed back to the input, and a value is taken out from the junction between the inverters as an operational mode control signal. The transmissions 11a and 11d and the clock gated inverters 11c and 11f, which are controlled with a write signal ($\overline{WR}$, WR) at a time of setting by software, are transferred from the single-chip mode of FIG. 6(a) to the external memory mode of FIG. 6(b) in the user mode by the program written in the ROM 23 in FIG. 6. In a reset sequence or at a time of initial setting, WR="L".

Figure 3:
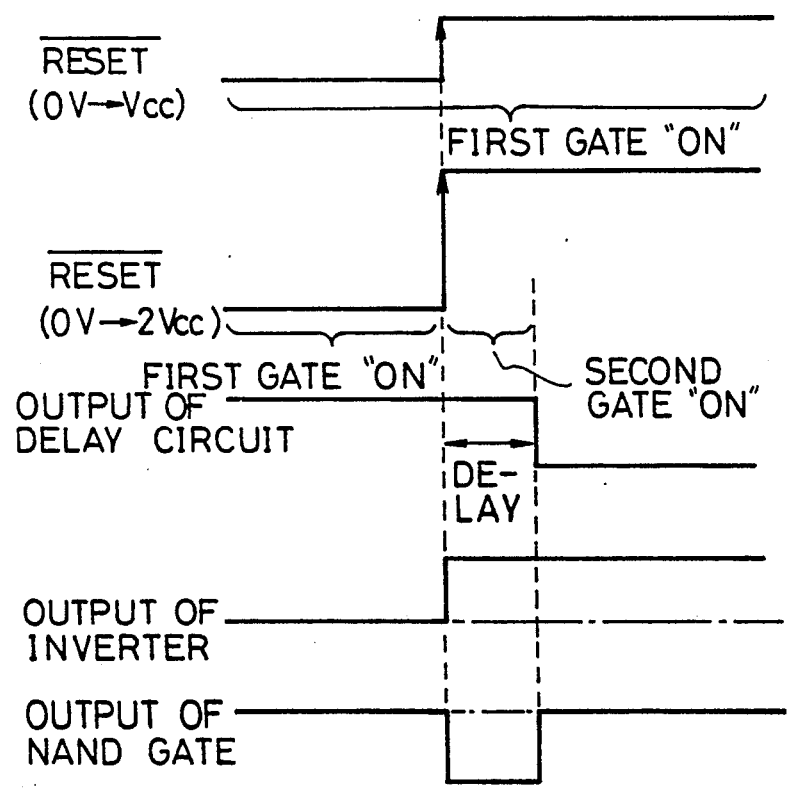
FIGS. 3 and 4 are timing charts for the operational mode control circuit of FIG. 2.

As shown in FIG. 3, when the reset input changes from 0 V to $V_{cc}$ (first level change), an output of the inverter 12e is "H", but an output of the inverter 12f remains "L" as indicated by the broken line so that an output of the NAND gate 12g is not made significant. Consequently, the first gate 16a of the mode setting control circuit 16 is turned on, but the second gate 16c remains off so that the operational mode register 11 holds "0" or the condition initialized with a reset input. As a result, an operational mode control signal indicating a user mode is outputted.

When the reset input changes from 0 V to 2 $V_{cc}$ (second level change), an output of the inverter 12e is "L" while an output of the inverter 12f becomes "H" as shown with a solid line so that an output of the NAND gate 12g is made significant. As a result, when the reset input is 0 V, the first gate 16a of the mode setting control circuit 16 is turned on to hold in the latch circuit 16b an operational mode control information ("1" in this case). When the reset input is at 2 $V_{cc}$, the second gate 16c is turned on during the delay to set the value of the latch circuit 16b in the operational mode register 11. As a result, an operational mode control signal inputted at the mode setting terminal 15a is outputted indicating a test or other operational mode.

Figure 4:
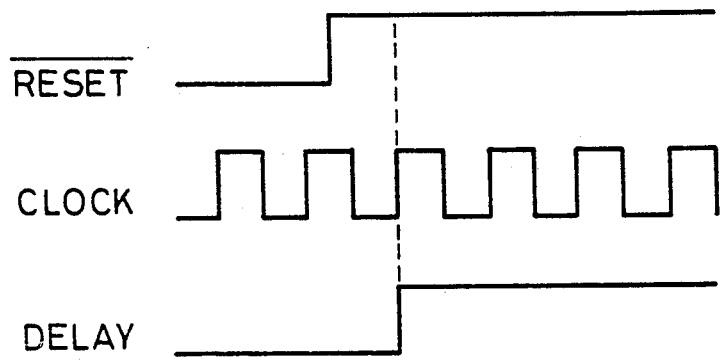

In FIG. 2, only two operational modes (user and test modes), and the one-bit operation register 11 are shown for simplicity, but the operational mode register 11, mode setting control circuit 16, and mode setting terminal 15a may be provided in a multiple stage configuration. For example, four or eight operational modes may be set by a two or three stage configuration. The delay circuit 12b of the level decision circuit 12, which is a multistage inverter, may be synchronized with clock as shown in FIG. 4. The latch circuit 16b of the mode setting control circuit 16 may be eliminated by putting a value of the mode setting terminal 15a into the operational mode register 11 at a rising edge from 0 V to 2 $V_{cc}$.

Figure 5:
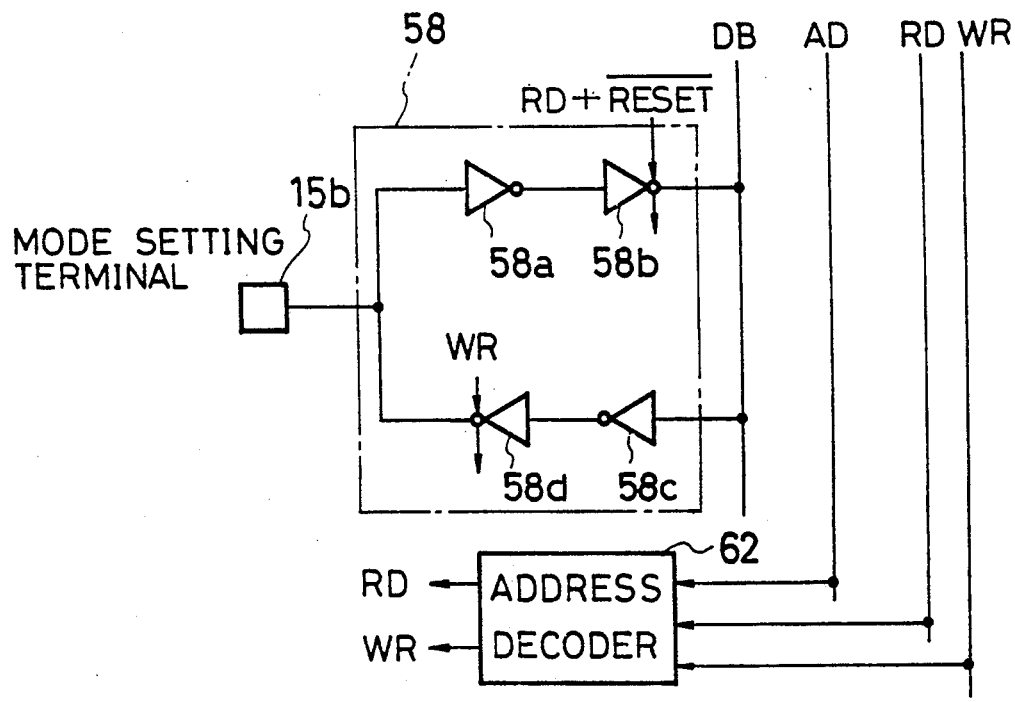
FIG. 5 is a schematic diagram of the essential part of FIG. 1(b)
Figure 7A:
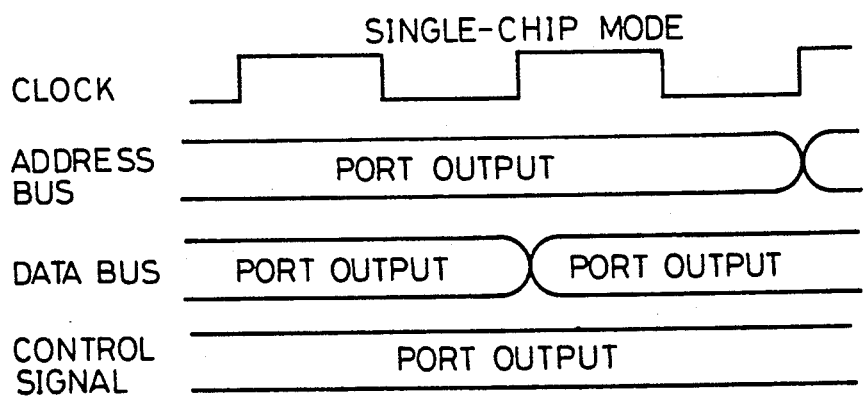
FIGS. 7(a), 7(b), and 7(c) are timing charts for the essential part of FIGS. 6(a), 6(b), and 6(c), respectively.
Figure 7B:
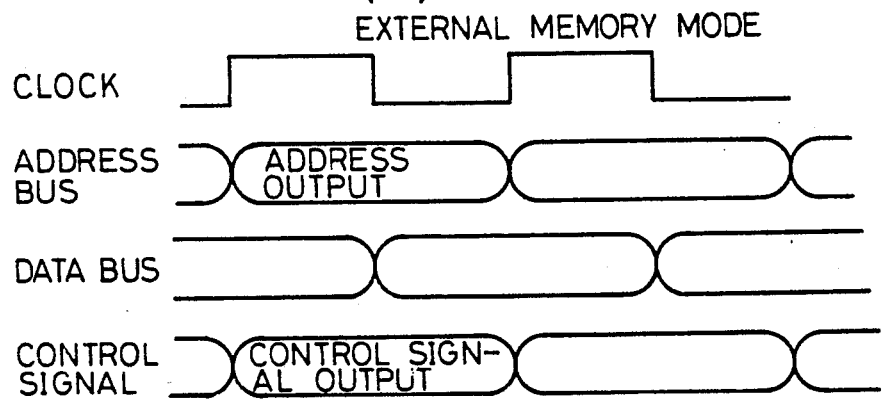
Figure 7C:
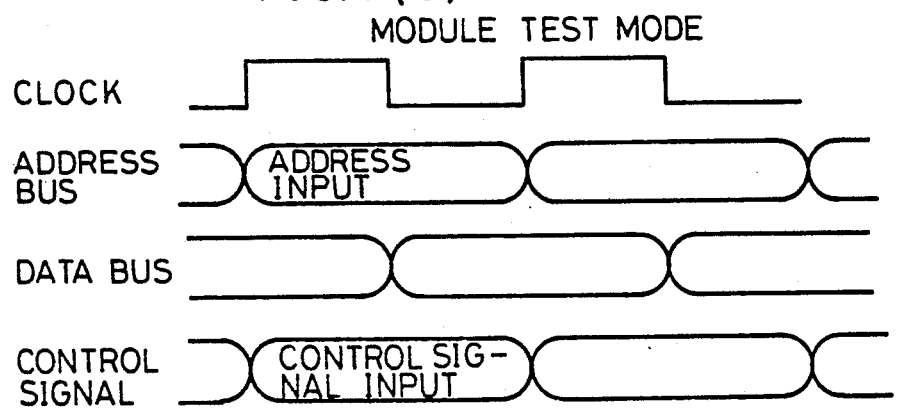

In the embodiment of FIG. 1(b), the port 58 as a data bus buffer has inverters 58a and 58b for reading and inverters 58c and 58d for writing as shown in FIG. 5. The respective inverters 58b and 58d are controlled with RD and WR signals from the address decoder 62 so that it is necessary to add a reset signal to the RD signal as a control signal for the read inverter 58b. In this case, without providing a new signal line S, the operational mode control information inputted at the mode setting terminal 15b is supplied to the mode setting control circuit 16, which is shown in detail in FIG. 2, via the port 58 and data bus 17.

As has been described above, with the embodiment of FIG. 1(a), data is fetched at a special level of a three-value reset input (for example, 2 $V_{cc}$) to set an operation mode so that the maker operation mode is set with higher degrees of freedom as well as the user operational mode.

With the embodiment of FIG. 1(b) in which the operational mode is set at a special level of a three-value reset input via a data bus from a data bus buffer in a microcomputer in which the operational mode register is accessed from the data bus, it is possible to reduce the signal line area by use of the data bus in addition to the above advantage.

In the above embodiments, the invention is applied to a single-chip microcomputer but it may be applied to other semiconductor integrated circuits such as DSP. The level decision circuit for detecting the 2 $V_{cc}$ level of a reset input may be replaced by another circuit capable of detecting a three-value input.

As has been described above, with the operational mode control unit according to the invention which sets predetermined operational mode control information in the operational mode setting unit when the reset input is in the first level change and the operational mode control information inputted at a predetermined terminal of the I/O port in the operational mode setting unit when the reset input is in the second level change, it is possible to not only eliminate the input terminal dedicated to set an operational mode but also allow setting a large number of operational modes.

We claim:

1. A semiconductor integrated circuit responsive to operational mode control information set in an operational mode setting unit to set a plurality of operational modes such as user and test modes, characterized by
    operational mode control means for setting a predetermined operational mode control information in said operational mode setting unit at a transitional edge of a reset input when said reset input takes a first level change and operational mode control information inputted at a predetermined terminal of an input/output terminal in said operation mode setting unit when said reset input takes a second level change.

2. The semiconductor integrated circuit of claim 1, wherein said operational mode setting unit consists of a register and said operational mode control means comprises:
    a level decision circuit for deciding reset signals from reset input terminal to set a predetermined operational mode control information in said operational mode register for said first level change; and
    a mode setting control circuit for setting operational mode control information inputted at a predetermined terminal of said input/output port in said operation mode register when said level decision circuit recognized that said reset input is in said second level change.

3. A semiconductor integrated circuit responsive to operation mode control information set in an operation mode setting unit to set a plurality of operation modes such as user and test modes, characterized by:
    operational mode control means for setting a predetermined operational mode control information in said operation mode setting unit at a transitional edge of a reset input when said reset input is in a first level change and operational mode control information inputted from a predetermined terminal of an input/output port via an internal data bus in said operational mode setting unit when said reset input is a second level change.

4. The semiconductor integrated circuit of claim 3, wherein said operational mode setting unit consists of a register and said operational mode control means comprises:

a level decision circuit for deciding levels of reset signals from reset input terminal and sets a predetermined operational mode control information in said operational mode register for said first level change; and a mode setting control circuit for setting operational mode control information inputted from a predetermined terminal of said input/output port via an internal data bus in said operation mode register when said level decision circuit recognizes that said reset input is in said second level change.

* * * * *